United States Patent
Wang

(10) Patent No.: US 10,778,240 B1
(45) Date of Patent: Sep. 15, 2020

(54) DEVICE AND METHOD FOR DIGITAL TO ANALOG CONVERSION

(71) Applicant: REALTEK SEMICONDUCTOR CORP., Hsinchu (TW)

(72) Inventor: Chih-Chiang Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/692,084

(22) Filed: Nov. 22, 2019

(30) Foreign Application Priority Data

Jul. 16, 2019 (TW) .............................. 108125144 A

(51) Int. Cl.
*H03M 1/66* (2006.01)
*H03M 1/08* (2006.01)
*H03M 3/00* (2006.01)

(52) U.S. Cl.
CPC ....... *H03M 1/0881* (2013.01); *H03M 1/0818* (2013.01); *H03M 3/348* (2013.01)

(58) Field of Classification Search
CPC ... H03M 1/0818; H03M 3/348; H03M 1/0881
USPC .............................................. 341/144, 68, 69
See application file for complete search history.

(56) References Cited

U.S. PATENT DOCUMENTS

| | | | |
|---|---|---|---|
| 5,367,302 A * | 11/1994 | Kalthoff | H03M 1/804 341/163 |
| 7,042,379 B2 | 5/2006 | Choe | |
| 7,382,301 B2 * | 6/2008 | Mourrier | H03M 1/822 341/144 |
| 8,493,253 B2 | 7/2013 | Tseng et al. | |

* cited by examiner

*Primary Examiner* — Peguy Jean Pierre
(74) *Attorney, Agent, or Firm* — Birch, Stewart, Kolasch & Birch, LLP

(57) ABSTRACT

A device and a method for digital to analog conversion are provided. The device contains a signal generation circuit and a conversion circuit. The signal generation circuit generates two reset signals which are a first reset signal and a second reset signal. The two reset signals are mutually inverted digital signals and contain the same number of bits. The conversion circuit converts a digital data signal into an analog data signal when a first clock signal is at a first level, and generates the analog data signal at two reset levels respectively according to the two reset signals when the first clock signal is at a second level.

10 Claims, 6 Drawing Sheets

| | | | | | |
|---|---|---|---|---|---|
| Second cycle | First reset signal S1 | 1 | 1 | 0 | 0 |
| | Second reset signal S2 | 0 | 0 | 1 | 1 |
| First cycle | Digital data signal D1[1] | 1 | 0 | 0 | 0 |
| Second cycle | First reset signal S1 | 1 | 1 | 0 | 0 |
| | Second reset signal S2 | 0 | 0 | 1 | 1 |
| First cycle | Digital data signal D1[2] | 0 | 1 | 1 | 0 |
| Second cycle | First reset signal S1 | 1 | 1 | 0 | 0 |
| | Second reset signal S2 | 0 | 0 | 1 | 1 |
| First cycle | Digital data signal D1[3] | 1 | 1 | 0 | 1 |
| Second cycle | First reset signal S1 | 1 | 1 | 0 | 0 |
| | Second reset signal S2 | 0 | 0 | 1 | 1 |

FIG. 4

| | | | | | |
|---|---|---|---|---|---|
| Second cycle { First reset signal S1 | 1 | 1 | 0 | 0 |
| Second cycle { Second reset signal S2 | 0 | 0 | 1 | 1 |
| First cycle   Digital data signal D1[1] | 1 | 0 | 1 | 0 |
| Second cycle { First reset signal S1 | 1 | 1 | 0 | 0 |
| Second cycle { Second reset signal S2 | 0 | 0 | 1 | 1 |
| First cycle   Digital data signal D1[2] | 0 | 1 | 1 | 0 |
| Second cycle { First reset signal S1 | 1 | 1 | 0 | 0 |
| Second cycle { Second reset signal S2 | 0 | 0 | 1 | 1 |
| First cycle   Digital data signal D1[3] | 0 | 1 | 1 | 1 |
| Second cycle { First reset signal S1 | 1 | 1 | 0 | 0 |
| Second cycle { Second reset signal S2 | 0 | 0 | 1 | 1 |

DEVICE AND METHOD FOR DIGITAL TO ANALOG CONVERSION

CROSS-REFERENCE TO RELATED APPLICATION

This non-provisional application claims priority under 35 U.S.C. § 119(a) to patent application Ser. No. 10/812,5144 in Taiwan, R.O.C. on Jul. 16, 2019, the entire contents of which are hereby incorporated by reference.

BACKGROUND

Technical Field

The present invention provides a device for digital to analog conversion, and in particular, to a device for digital to analog conversion using the return-to-zero technology.

Related Art

Recently, there is an increasing demand for digital to analog converters in electronic products. In most applications, high-precision digital to analog conversion is required. There are many factors that affect the precision of digital to analog conversion, one of which is inter symbol interference (ISI). In particular, a digital to analog converter contains a current cell, and the inter symbol interference refers to an output error which is a signal dependent transition charge. For example, the input values processed by the digital to analog converter with a plurality of continuous high levels will contribute different transition charge errors from the input values processed by the digital to analog converter with a high level to a low level.

To reduce the inter symbol interference, an analog return-to-zero technology has been proposed. The inter symbol interference can be reduced by the analog return-to-zero technology. However, if the rising times and the falling times of output signals of the digital to analog converter are inconsistent, the effect of the analog return-to-zero technology on reducing the inter symbol interference will be lowered. A digital return-to-zero technology also has been proposed, which can also reduce the inter symbol interference. However, the digital return-to-zero technology generates additional noise and therefore is not suitable for digital to analog converters having high requirements on the signal to noise ratio (SNR). Therefore, it is necessary to propose a novel digital return-to-zero technology, which can effectively reduce the inter symbol interference without generating additional noise even if the rising times and the falling times are inconsistent.

SUMMARY

In some embodiments, a device for digital to analog conversion contains a signal generation circuit and a first conversion circuit. The signal generation circuit is configured to generate a first reset signal and a second reset signal, where the first reset signal and the second reset signal are mutually inverted digital signals and contain the same number of bits. The first conversion circuit is coupled to the signal generation circuit. The first conversion circuit is configured to receive a first clock signal and a digital data signal, convert the digital data signal into a first analog data signal when the first clock signal is at a first cycle of a first level, and when the first clock signal is at a second cycle of a second level, generate, according to the first reset signal, the first analog data signal which is at a first reset level after resetting, and generate, according to the second reset signal, the first analog data signal which is at a second reset level after resetting.

In some embodiments, a method for digital to analog conversion contains: generating a first reset signal which is a digital signal by a signal generation circuit; generating a second reset signal which is a digital signal by the signal generation circuit; receiving a first clock signal, the first reset signal, and the second reset signal by a first conversion circuit, wherein the first clock signal comprises a first level and a second level; converting the digital data signal into a first analog data signal by the first conversion circuit when the first clock signal is at a first cycle of the first level; generating, by the first conversion circuit according to the first reset signal when the first clock signal is at a second cycle of the second level, the first analog data signal which is at a first reset level after resetting; and generating, by the first conversion circuit according to the second reset signal when the first clock signal is at the second cycle of the second level, the first analog data signal which is at a second reset level after resetting. The second reset signal is inverted with respect to the first reset signal, and the second reset signal and the first reset signal contain the same number of bits.

Based on the above, according to some embodiments of the device for digital to analog conversion in the present invention, although the digital data signal at different time points processed by the device for digital to analog conversion are different, the number of times by which the level is changed by each current cell of the device for digital to analog conversion is fixed. And the direction of the level change of each current cell of the device for digital to analog conversion among the second return-to-zero conversion, the digital to analog conversion, and the first return-to-zero conversion is fixed. In other words, in each time interval among the second return-to-zero conversion, the digital to analog conversion, and the first return-to-zero conversion, the analog output signal corresponding to the digital signal of each first cycle is accompanied by a fixed charge increment or decrement regardless of the digital signal pattern. That is to say, the charge increase or decrease of the analog signal output is no longer dependent on the digital data signal, thereby greatly reducing the inter symbol interference.

BRIEF DESCRIPTION OF THE DRAWINGS

FIG. 4 is a diagram of an implementation of a digital data signal and two reset signals in FIG. 2;

FIG. 5 is a diagram of another implementation of a digital data signal and two reset signals in FIG. 2;

DETAILED DESCRIPTION

Figure 1:
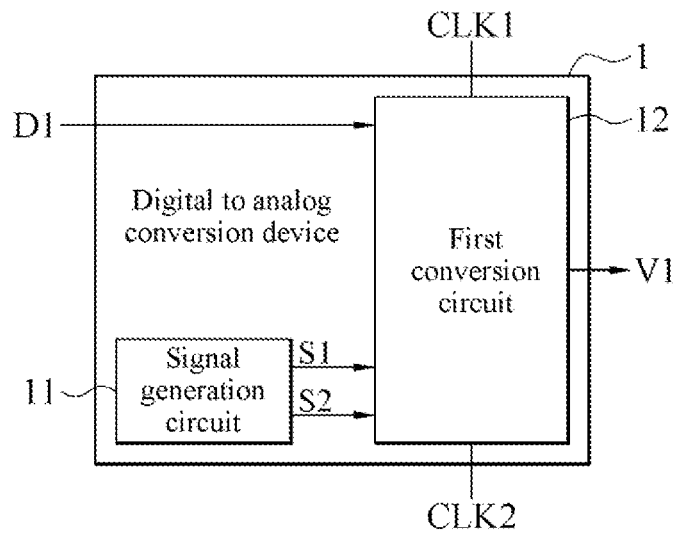
FIG. 1 is a schematic circuit block diagram of a device for digital to analog conversion according to some embodiments of the present invention.

FIG. 1 is a schematic circuit block diagram of a device for digital to analog conversion according to some embodiments of the present invention. Referring to FIG. 1, the device 1 for digital to analog conversion contains a signal generation circuit 11 and a conversion circuit (hereinafter referred to as a first conversion circuit 12 for ease of description). FIG. 1 is only an example in which the digital conversion device 1 contains the first conversion circuit 12. The signal generation circuit 11 is coupled to the first conversion circuit 12. The signal generation circuit 11 generates two reset signals (hereinafter referred to as a first reset signal S1 and a second reset signal S2). The first reset signal S1 and the second reset signal S2 are mutually inverted digital signals and contain the same number of bits.

For example, the numbers of bits contained in the first reset signal S1 and the second reset signal S2 may both be four, that is, the first reset signal S1 and the second reset signal S2 both contain four bits. For example, if numbers of high-level bits in the first reset signal S1 and the second reset signal S2 are "2", numbers of low-level bits in the first reset signal S1 and the second reset signal S2 are also "2". For example, the four bits of the first reset signal S1 may be "1", "1", "0", and "0" in sequence from most significant to least significant, and the four bits of the second reset signal S2 may be "0", "0", "1", and "1" in sequence from most significant to least significant. In some embodiments, "1" and "0" in each of the digital data signal D1, the first reset signal S1, and the second reset signal S2 are converted into analog signals of the same magnitude but in opposite directions through current cells contained in the first conversion circuit 12, represented as +I and −I.

The first conversion circuit 12 receives the first reset signal S1 and the second reset signal S2 generated by the signal generation circuit 11, and the first conversion circuit 12 receives a digital data signal D1 from a data generation circuit unit and a clock signal from a clock generation unit (hereinafter referred to as a first clock signal CLK1). Referring to FIG. 1 to FIG. 4, the first clock signal CLK1 contains a plurality of cycles corresponding to two levels respectively (hereinafter, the two levels of the first clock signal CLK1 are respectively referred to as a first level and a second level, and the cycles in which the first clock signal CLK1 is at the first level and the second level are respectively referred to as a first cycle and a second cycle). The first conversion circuit 12 contains a plurality of current cells corresponding to the digital data signal D1 having a plurality of bits. The first conversion circuit 12 performs digital to analog conversion on the digital data signal D1 according to the first clock signal CLK1 through the current cells, and performs return-to-zero conversion according to the first clock signal CLK1, the first reset signal S1, and the second reset signal S2 to generate a first analog data signal V1. In some embodiments, the first level is inverted with respect to the second level, the first level may be a high level such as a logic "1", and the second level may be a low level such as a logic "0". The digital data signal D1 can be binary weighted or equally weighted. And the first reset signal S1 and the second reset signal S2 and the current cells must be weighted accordingly.

Figure 2:
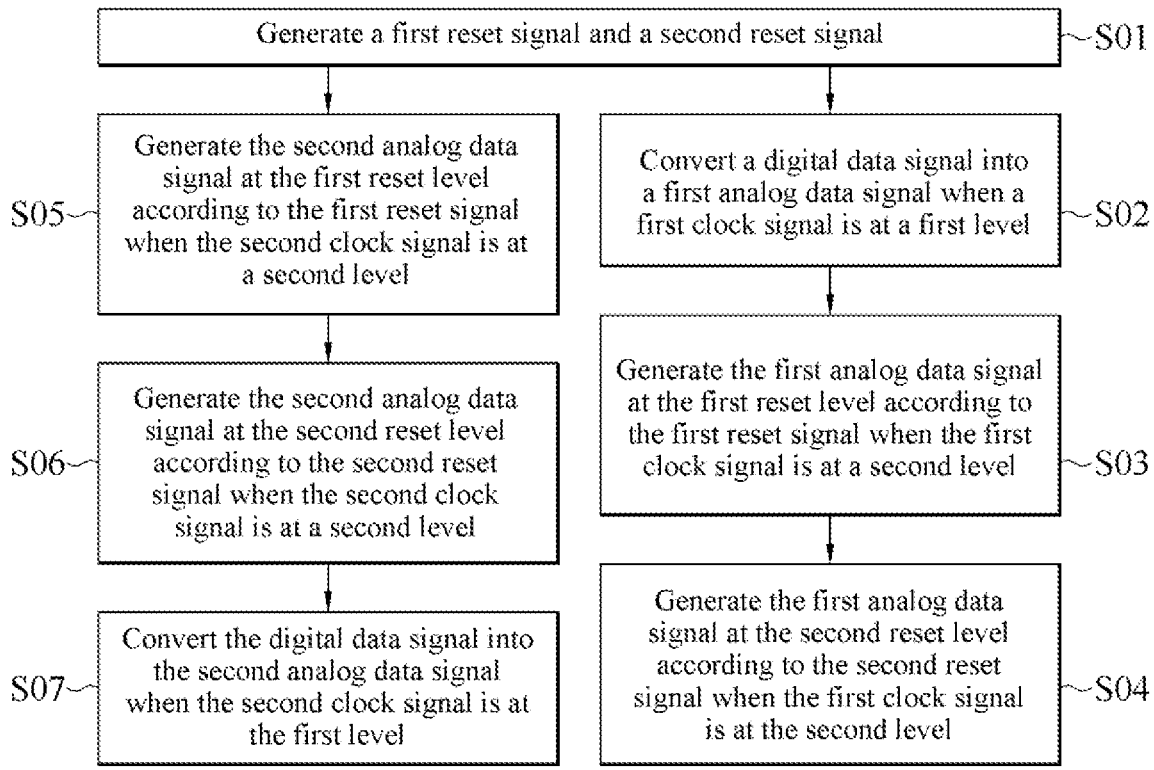
FIG. 2 is a flowchart of a method for digital to analog conversion according to some embodiments of the present invention.

Referring to FIG. 1 and FIG. 2, FIG. 2 is a flowchart of a method for digital to analog conversion according to some embodiments of the present invention. When the device 1 for digital to analog conversion is in operation, the signal generation circuit 11 generates the first reset signal S1 and the second reset signal S2 (step S01). In a first cycle, the first conversion circuit 12 performs digital to analog conversion when the first clock signal CLK1 is at the first level to convert the digital data signal D1 into the first analog data signal V1 (step S02). Then, in a second cycle, the first conversion circuit 12 performs digital return-to-zero conversion (hereinafter referred to as first return-to-zero conversion) according to the first reset signal S1 when the first clock signal CLK1 is at the second level, to generate the first analog data signal V1 at a reset level (hereinafter referred to as a first reset level) (step S03). The first conversion circuit 12 performs another digital return-to-zero conversion (hereinafter referred to as second return-to-zero conversion) according to the second reset signal S2 when the first clock signal CLK1 is at the second level, to generate the first analog data signal V1 at another reset level (hereinafter referred to as a second reset level) (step S04). The second reset level may be the same as or different from the first reset level.

Figure 3:
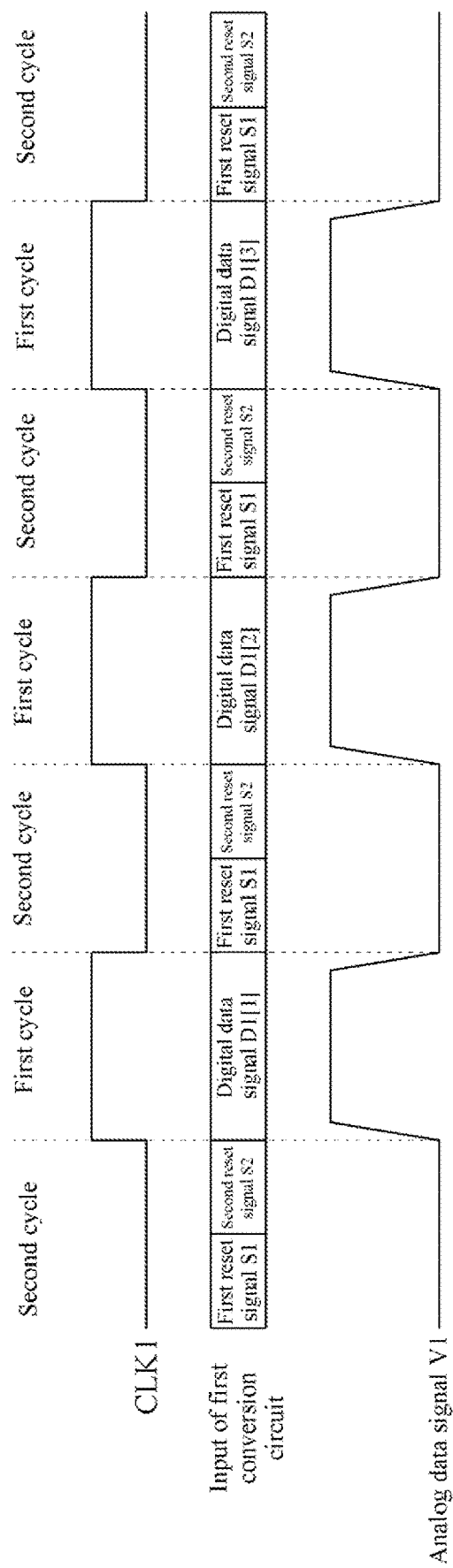
FIG. 3 show waveforms diagram of an implementation of signals during operation of the device for digital to analog conversion in FIG. 1.

Referring to FIG. 1 to FIG. 4, FIG. 3 show waveforms of an implementation of signals during operation of the device for digital to analog conversion. FIG. 3 shows an example in which the device 1 for digital to analog conversion receives three digital data signals D1[1], D1[2], and D1[3] and the first reset level and the second reset level both have a voltage value of 0 V. The first conversion circuit 12 performs analog conversion on the digital data signal D1[1] in the first cycle to convert the digital data signal D1[1] into the corresponding first analog data signal V1, and performs two return-to-zero conversions sequentially according to the first reset signal S1 and the second reset signal S2 in the second cycle to generate the first analog data signal V1 which is at the reset level of 0 V after resetting. Then, the first conversion circuit 12 performs analog conversion on the digital data signal D1[2] in the first cycle to convert the digital data signal D1[2] into the corresponding first analog data signal V1, and performs two return-to-zero conversions sequentially according to the first reset signal S1 and the second reset signal S2 in the second cycle to generate the first analog data signal V1 which is at the reset level of 0 V after resetting. Further, the first conversion circuit 12 performs analog conversion on the digital data signal D1[3] in the first cycle to convert the digital data signal D1[3] into the corresponding first analog data signal V1, and performs two return-to-zero conversions sequentially according to the first reset signal S1 and the second reset signal S2 in the second cycle to generate the first analog data signal V1 which is at the reset level of 0 V after resetting.

Referring to FIG. 1 to FIG. 4, FIG. 4 is diagram of an implementation of the digital data signals D1[1], D1[2], and D1[3] and the two reset signals S1 and S2 in FIG. 2. FIG. 4 shows an example in which the four bits of the first reset signal S1 are "1", "1", "0", and "0" in sequence from most significant bit to least significant bit and the four bits of the second reset signal S2 are "0", "0", "1", and "1" in sequence from most significant bit to least significant bit. In addition, the equally weighted digital data signals D1[1] to D1[3] using the data weighted averaging (DWA) technology are used as examples in FIG. 4. For the digital data signal D1[1], the levels of three bits are changed before and after the first clock signal CLK1 is at a positive edge, and the level of one bit is changed before and after the first clock signal CLK1 is at a negative edge, that is, the levels of a total of four bits are changed in the first cycle. For the digital data signal D1[2], the levels of two bits are changed before and after the first clock signal CLK1 is at the positive edge, and the levels of two bits are changed before and after the first clock signal CLK1 is at the negative edge, that is, the levels of a total of four bits are changed in the first cycle. For the digital data signal D1[3], the levels of three bits are changed before and after the first clock signal CLK1 is at the positive edge, and the level of one bit is changed before and after the first clock signal CLK1 is at the negative edge, that is, a total of four bits of the level are changed in the first cycle. Based on this, for the digital data signals D1[1], D1[2], and D1[3], there are the same number (that is, 4) of bits whose levels are changed before and after the first clock signal CLK1 is at the positive edge and the negative edge.

Further, in a time interval of processing the digital data signals D1[1] to D1[3], for the current cell that processes the most significant bit in the first conversion circuit 12, the directions of signal transitions due to the differences between the digital data signals D1[1] to D1[3] are fixed (from logic "0" to logic "1"). For the current cell that processes the second most significant bit in the first conversion circuit 12, the directions of signal transitions due to the differences between the digital data signals D1[1] to D1[3] are fixed (from logic "0" to logic "1"). For the current cell that processes the second least significant bit in the first conversion circuit 12, the directions of signal transitions due to the differences between the digital data signals D1[1] to D1[3] are fixed (from logic "1" to logic "0"). For the current cell that processes the least significant bit in the first conversion circuit 12, the directions of signal transitions due to the differences between the digital data signals D1[1] to D1[3] are fixed (from logic "1" to logic "0").

Further, in a time interval shown in FIG. 4, for the current cell that processes the most significant bit in the first conversion circuit 12, the number of times the signal changes from logic "0" to logic "1" due to the differences between the digital data signals D1[1] to D1[3] is three. For the current cell that processes the second most significant bit in the first conversion circuit 12, the number of times the signal changes from logic "0" to logic "1" due to the differences between the digital data signals D1[1] to D1[3] is also three. For the current cell that processes the second least significant bit in the first conversion circuit 12, the number of times the signal changes from logic "1" to logic "0" due to the differences between the digital data signals D1[1] to D1[3] is also three. For the current cell that processes the least significant bit in the first conversion circuit 12, the number of times the signal changes from logic "1" to logic "0" due to the differences between the digital data signals D1[1] to D1[3] is also three. In other words, for the current cells that respectively process the bits in the first conversion circuit 12, the number of times the signal changes due to the differences between the digital data signals D1[1] to D1[3] is fixed (for each of the current cells, the number of times the signal changes due to the differences between the digital data signals D1[1] to D1[3] is three).

Based on this, the total number of signal transitions between the second return-to-zero conversion, the digital-to-analog conversion, and the first return-to-zero conversion is fixed, regardless of the digital data signal D1 the first conversion circuit 12 processes, and the number (which is 1) of times by which the level of each bit changes and the direction of the level change due to the different digital data signals D1 at different time points (i.e. D1[1] to D1[3]) processes by the current cells in the first conversion circuit 12 in a certain time interval (between the second return-to-zero conversion, the digital-to-analog conversion, and the first-to-zero conversion) are also fixed. In other words, regardless of how the digital data signal D1 changes, an additional current or charge amount generated due to the level transition of each bit is fixed in each time interval (between the second return-to-zero conversion, the digital-to-analog conversion, and the first return-to-zero conversion). That is to say, the output of the first conversion circuit 12 contains, in addition to the digital signal data D1, only a fixed current or charge amount per fixed time interval, ideally eliminating the inter symbol interference.

In some embodiments, the digital data signal D1 can also be a digital data signal D1 using the sigma-delta modulation (SDM) coding technology, or a digital data signal D1 with arbitrary coding technology. Referring to FIG. 5, the digital data signal D1 with arbitrary coding technology is used as an example. As shown in FIG. 5, the total number of signal transitions between the second return-to-zero conversion, the digital-to-analog conversion, and the first return-to-zero conversion due to the fact that the first conversion circuit 12 processes different digital data signals D1 is fixed, and the number of times by which the level of each bit changes and the direction of the level change due to different digital data signals D1 at different time points processes by the current cells in the first conversion circuit 12 in a certain time interval are also fixed.

In some embodiments, the first reset signal S1 and the second reset signal S2 each contain an even number of bits. For example, the first reset signal S1 and the second reset signal S2 each contain four bits. In some other embodiments, the first reset signal S1 and the second reset signal S2 may each contain an odd number of bits. For example, the first reset signal S1 and the second reset signal S2 each contain three bits.

In some embodiments, taking the first reset signal S1 and the second reset signal S2 each including an even number of bits as an example, the number of high-level bits in the first reset signal S1 and the number of high-level bits in the second reset signal S2 are even numbers, and the number of low-level bits in the first reset signal S1 and the number of low-level bits in the second reset signal S2 are also even numbers. For example, taking the first reset signal S1 and the second reset signal S2 each including six bits as an example, the number of high-level bits in the first reset signal S1 may be an even number "4", and the number of low-level bits in the first reset signal S1 may be an even number "2"; while the number of high-level bits in the second reset signal S2 which is inverted with respect to the first reset signal S1 may be an even number "2", and the number of low-level bits in the second reset signal S2 may be an even number "4". For example, the first reset signal S1 may be "0", "0", "1", "1", "1", "1", and the second reset signal S2 may be "1", "1", "0", "0", "0", "0".

Further, taking the first reset signal S1 and the second reset signal S2 each including four bits as an example, the number of high-level bits in the first reset signal S1 and the number of high-level bits in the second reset signal S2 may be the same even number, and the number of low-level bits in the first reset signal S1 and the number of low-level bits in the second reset signal S2 may also be the same even number, for example, "2". In other words, the number of high-level bits in the first reset signal S2 is equal to the number of high-level bits in the second reset signal S2, and the number of low-level bits in the first reset signal S2 is equal to the number of low-level bits in the second reset signal S2. That is, the four bits of the first reset signal S1 are "1", "1", "0", and "0" in sequence from most significant bit to least significant bit, and the four bits of the second reset signal S2 are "0", "0", "1", and "1" in sequence from most significant bit to least significant bit. Based on this, the first conversion circuit 12 performs the first return-to-zero conversion and the second return-to-zero conversion according to the first reset signal S1 and the second reset signal S2 having the same number of high-level bits and low-level bits to generate the first analog data signals V1 which have the same reset level, that is, the first reset level is equal to the second reset level.

Further, in some other embodiments, taking the first reset signal S1 and the second reset signal S2 each including an even number of bits as an example, the number of high-level bits in the first reset signal S1 and the number of high-level bits in the second reset signal S2 may be odd numbers, and the number of low-level bits in the first reset signal S1 and the number of low-level bits in the second reset signal S2 may also be odd numbers. For example, taking the first reset signal S1 and the second reset signal S2 each including four bits as an example, the number of high-level bits in the first reset signal S1 may be an odd number "3", and the number of low-level bits in the first reset signal S1 may be an odd number "1"; while the number of high-level bits in the second reset signal S2 which is inverted with respect to the first reset signal S1 may be an odd number "1", and the number of low-level bits in the second reset signal S2 may be an odd number "3". For example, the four bits of the first reset signal S1 are "1", "1", "1", "0" from most significant bit to least significant bit, and the four bits of the second reset signal S2 are "0", "0", "0", and "1" from most significant bit to least significant bit. Other embodiments of the first reset signal S1 and the second reset signal S2 can be deduced by analogy, and the details will not be described herein again. Based on this, the designer of the device 1 for digital to analog conversion can design at will the number of high-level bits and the number of low-level bits in the reset signals S1 and S2 to be odd or even numbers.

Figure 6:
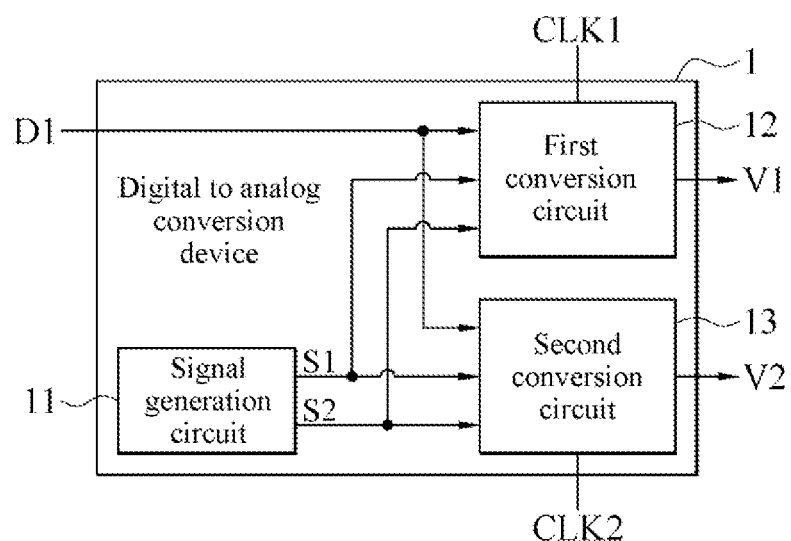
FIG. 6 is a schematic circuit block diagram of an implementation of the device for digital to analog conversion in FIG. 1.

In some embodiments, the device 1 for digital to analog conversion contains two conversion circuits. FIG. 6 is a schematic circuit block diagram of an implementation of the device 1 for digital to analog conversion in FIG. 1. Referring to FIG. 6, the device 1 for digital to analog conversion contains two conversion circuits (hereinafter referred to as a first conversion circuit 12 and a second conversion circuit 13). The operation and the connection relationship of the first conversion circuit 12 have been described in detail above and will not be described herein again.

The second conversion circuit 13 is coupled to the signal generation circuit 11. The second conversion circuit 13 receives the two reset signals S1 and S2 generated by the signal generation circuit 11, the digital data signal D1, and a second clock signal CLK2. The second clock signal CLK2 is inverted with respect to the first clock signal CLK1. That is, when the first clock signal CLK1 is at the first level, the second clock signal CLK2 is at the second level which is inverted with respect to the first level; when the first clock signal CLK1 is at the second level, the second clock signal CLK2 is at the first level which is inverted with respect to the second level. The second clock signal CLK2 contains a third cycle corresponding to the first level and a fourth cycle corresponding to the second level. The second conversion circuit 13 performs digital to analog conversion, first return-to-zero conversion, and second return-to-zero conversion according to the second clock signal CLK2 which is inverted with respect to the first clock signal CLK1.

In particular, referring to FIG. 2 to FIG. 7, FIG. 7 show waveforms of an implementation of signals during operation of the device 1 for digital to analog conversion 1. In the first cycle of the first clock signal CLK1, that is, when the first conversion circuit 12 performs digital to analog conversion on the digital data signal D1, the second clock signal CLK2 is in the fourth cycle of the second level. When the second clock signal CLK2 is in the fourth cycle of the second level, the second conversion circuit 13 performs the first return-to-zero conversion according to the first reset signal S1 to generate the second analog data signal V2 which is at the first reset level (step S05 in FIG. 2), and performs the second return-to-zero conversion according to the second reset signal S2 to generate the second analog data signal V2 which is at the second reset level (step S06 in FIG. 2). In the second cycle of the first clock signal CLK1, that is, when the first conversion circuit 12 performs the first return-to-zero conversion and the second return-to-zero conversion respectively according to the reset signals S1 and S2, the second clock signal CLK2 is in the third cycle of the first level. The second conversion circuit 13 converts the same digital data signal D1 into the second analog data signal V2 in the third cycle (step S07). Based on this, in one cycle of the second clock signal CLK2 and one cycle of the first clock signal CLK1 (that is, the third cycle and the first cycle), the first analog data signal V1 and the second analog data signal V2 form a complete analog data signal together, thereby eliminating the adverse effects caused by the use of the return-to-zero technology, such as sensitivity to clock signal jitter.

In some other embodiments, the second conversion circuit 13 may receive other reset signals generated by the signal generation circuit 11 (hereinafter referred to as a third reset signal and a fourth reset signal). The third reset signal and the fourth reset signal are different from the reset signals S1 and S2, and the third reset signal and the fourth reset signal are mutually inverted and contain the same number of bits. The second conversion circuit 13 may perform return-to-zero conversion according to the third reset signal and the fourth reset signal in the fourth cycle to respectively generate the second analog data signals V2 after resetting.

Figure 7:
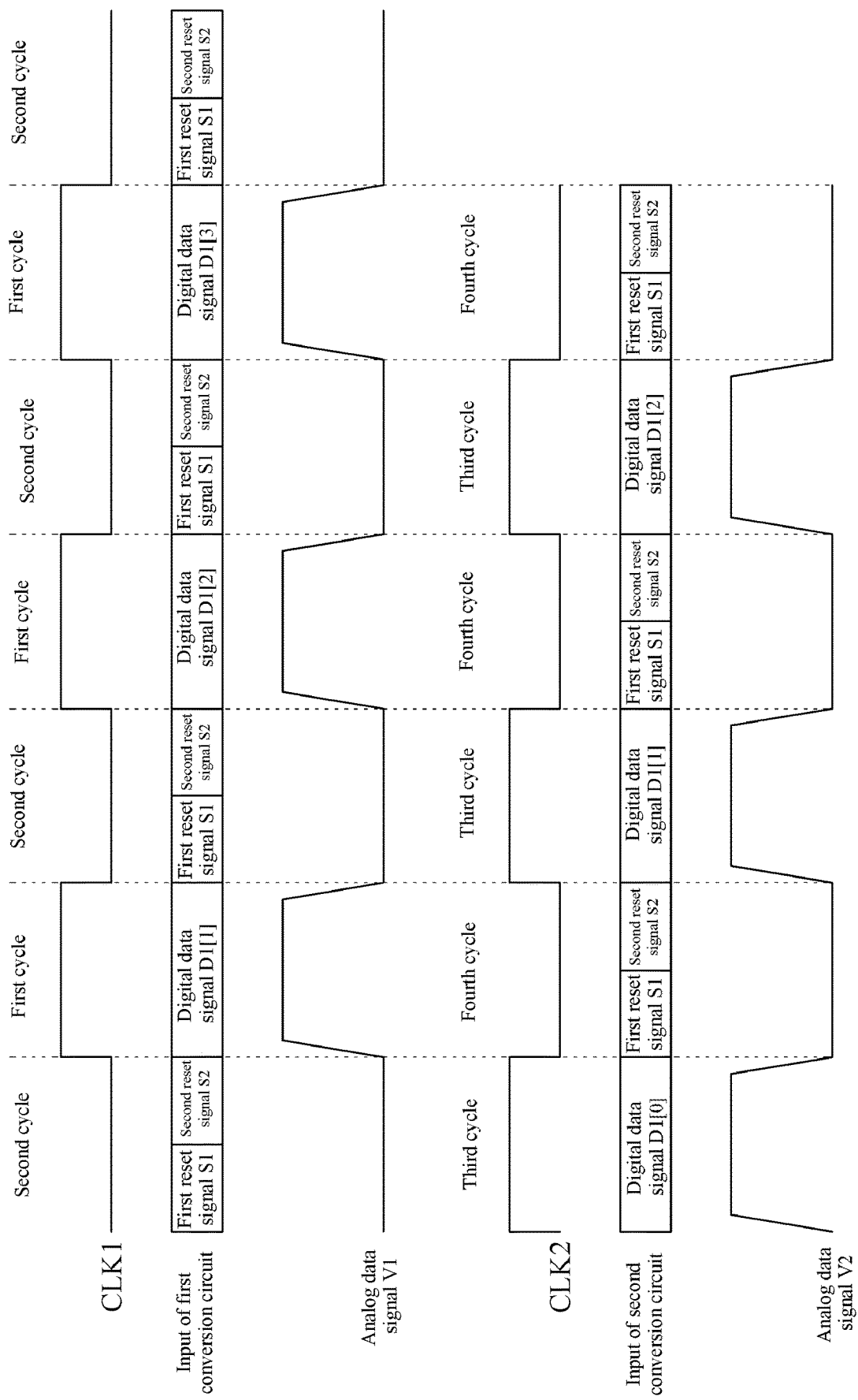
FIG. 7 show waveforms diagram of an implementation of signals during operation of the device for digital to analog conversion in FIG. 6.

In some embodiments, referring to FIG. 7, the duty cycle of the clock signals CLK1 and CLK2 is 50%, and a time length required for the first conversion circuit 12 to perform the first return-to-zero conversion according to the first reset signal S1 and the second return-to-zero conversion according to the second reset signal S2 is a half cycle, that is, half the second cycle. That is, the time length required for the first conversion circuit 12 to perform one of the first return-to-zero conversion and the second return-to-zero conversion is less than that required for performing digital to analog conversion. Similarly, a time length required for the second conversion circuit 13 to perform the first return-to-zero conversion according to the first reset signal S1 and the second return-to-zero conversion according to the second reset signal S2 is also a half cycle, that is, half the fourth cycle. That is, the time length required for the second conversion circuit 13 to perform one of the first return-to-zero conversion and the second return-to-zero conversion is less than that required for performing digital to analog conversion.

In some embodiments, the signal generation circuit 11 may be implemented by a digital circuit, that is, using an electronic design automation (EDA) tool to perform simulation with hardware description languages (HDLs) followed by synthesis, auto placement and routing (APR) and tape-out for fabricating a physical chip, for the digital circuit, or may be implemented by a field programmable gate array (FPGA) after simulation with HDLs.

Based on the above, according to some embodiments of the device for digital to analog conversion in the present invention, although the digital data signal at different time points processed by the device for digital to analog conversion are different, the number of times by which the level is changed by each current cell of the device for digital to analog conversion is fixed. And the direction of the level change of each current cell of the device for digital to analog conversion among the second return-to-zero conversion, the digital to analog conversion, and the first return-to-zero conversion is fixed. In other words, regardless of how the digital data signal D1 changes, an additional current or charge amount generated due to the level transition of each bit is fixed in each time interval (between the second return-to-zero conversion, the digital-to-analog conversion, and the first return-to-zero conversion). That is to say, the output of the first conversion circuit 12 contains, in addition to a multiple of the digital signal data D1, only a fixed current or charge amount per fixed time interval, ideally eliminating the inter symbol interference.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A device for digital to analog conversion, comprising:
   a signal generation circuit, configured to generate a first reset signal and a second reset signal, wherein the first reset signal and the second reset signal are mutually inverted and the first reset signal and the second reset signal are digital signals and comprise the same number of bits; and
   a first conversion circuit, coupled to the signal generation circuit, and configured to receive a first clock signal and a digital data signal, convert the digital data signal into a first analog data signal when the first clock signal is at a first cycle of a first level, and when the first clock signal is at a second cycle of a second level, generate, according to the first reset signal, the first analog data signal which is at a first reset level after resetting, and generate, according to the second reset signal, the first analog data signal which is at a second reset level after resetting.

2. The device for digital to analog conversion according to claim 1, wherein a number of high-level bits in the first reset signal is equal to a number of high-level bits in the second reset signal, the number of high-level bits in the first reset signal and the number of high-level bits in the second reset signal are even numbers, a number of low-level bits in the first reset signal is equal to a number of low-level bits in the second reset signal, and the number of low-level bits in the first reset signal and the number of low-level bits in the second reset signal are even numbers.

3. The device for digital to analog conversion according to claim 2, wherein the first reset level is equal to the second reset level.

4. The device for digital to analog conversion according to claim 1, wherein a number of high-level bits in the first reset signal and a number of high-level bits in the second reset signal are odd numbers, and a number of low-level bits in the first reset signal and a number of low-level bits in the second reset signal are odd numbers.

5. The device for digital to analog conversion according to claim 1, further comprising:
   a second conversion circuit, coupled to the signal generation circuit, and configured to receive the first reset signal, the second reset signal, and a second clock signal, wherein the second clock signal comprises the first level and the second level, the first clock signal is at the second level when the second clock signal is at the first level, and the first clock signal is at the first level when the second clock signal is at the second level; when the second clock signal is at a fourth cycle of the second level, the second conversion circuit generates, according to the first reset signal, a second analog data signal which is at the first reset level after resetting, and generates, according to the second reset signal, the second analog data signal which is at the second reset level after resetting; and the second conversion circuit converts the digital data signal into the second analog data signal when the second clock signal is at a third cycle of the first level.

6. A method for digital to analog conversion, comprising:
   generating a first reset signal which is a digital signal by a signal generation circuit;
   generating a second reset signal which is a digital signal by the signal generation circuit, wherein the second reset signal is inverted with respect to the first reset signal, and the second reset signal and the first reset signal comprise the same number of bits;
   receiving a first clock signal, the first reset signal, and the second reset signal by a first conversion circuit, wherein the first clock signal comprises a first level and a second level;
   converting the digital data signal into a first analog data signal by the first conversion circuit when the first clock signal is at a first cycle of the first level;
   generating, by the first conversion circuit according to the first reset signal when the first clock signal is at a second cycle of the second level, the first analog data signal which is at a first reset level after resetting; and
   generating, by the first conversion circuit according to the second reset signal when the first clock signal is at the second cycle of the second level, the first analog data signal which is at a second reset level after resetting.

7. The method for digital to analog conversion according to claim 6, wherein in the steps of the signal generation circuit generating the first reset signal and the second reset signal, a number of high-level bits in the first reset signal generated by the signal generation circuit is equal to a number of high-level bits in the second reset signal, the number of high-level bits in the first reset signal and the number of high-level bits in the second reset signal are even numbers, a number of low-level bits in the first reset signal is equal to a number of low-level bits in the second reset signal, and the number of low-level bits in the first reset signal and the number of low-level bits in the second reset signal are even numbers.

8. The method for digital to analog conversion according to claim 6, wherein in the step of generating the first analog data signal at the second reset level, the second reset level is equal to the first reset level.

9. The method for digital to analog conversion according to claim 6, wherein in the step of the signal generation circuit generating the first reset signal and the second reset signal, a number of high-level bits in the first reset signal generated by the signal generation circuit and a number of high-level bits in the second reset signal are odd numbers, and a number of low-level bits in the first reset signal and a number of low-level bits in the second reset signal are odd numbers.

10. The method for digital to analog conversion according to claim 6, further comprising:
- receiving a second clock signal by a second conversion circuit, wherein the second clock signal comprises the first level and the second level, the first clock signal is at the second level when the second clock signal is at the first level, and the first clock signal is at the first level when the second clock signal is at the second level;
- generating, by the second conversion circuit according to the first reset signal when the second clock signal is at a fourth cycle of the second level, a second analog data signal which is at the first reset level after resetting;
- generating, by the second conversion circuit according to the second reset signal when the second clock signal is at the fourth cycle of the second level, the second analog data signal which is at the second reset level after resetting; and
- converting, by the second conversion circuit, the digital data signal into the second analog data signal when the second clock signal is at a third cycle of the first level.

* * * * *